(12) United States Patent
Chen

(10) Patent No.: US 11,289,549 B2
(45) Date of Patent: Mar. 29, 2022

(54) DISPLAY PANEL AND TERMINAL DEVICE

(71) Applicant: Beijing Xiaomi Mobile Software Co., Ltd., Beijing (CN)

(72) Inventor: Chaoxi Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/815,854

(22) Filed: Mar. 11, 2020

(65) Prior Publication Data

US 2021/0074777 A1 Mar. 11, 2021

(30) Foreign Application Priority Data

Sep. 11, 2019 (CN) .......................... 201910857124.4

(51) Int. Cl.
*H01L 27/32* (2006.01)
*H01L 51/50* (2006.01)
*G06K 9/00* (2022.01)
*H04M 1/02* (2006.01)

(52) U.S. Cl.
CPC ...... *H01L 27/3227* (2013.01); *G06K 9/00013* (2013.01); *H01L 27/3234* (2013.01); *H01L 27/3246* (2013.01); *H01L 51/5056* (2013.01); *H01L 51/5072* (2013.01); *H04M 1/0264* (2013.01)

(58) Field of Classification Search
None
See application file for complete search history.

(56) References Cited

U.S. PATENT DOCUMENTS

2016/0233278 A1* 8/2016 Yoon ..................... H01L 27/326
2018/0129852 A1  5/2018 Zeng et al.
2018/0233694 A1* 8/2018 Ajiki .................... H01L 27/3246
2019/0050621 A1* 2/2019 Xu ........................ G06K 9/0004
2019/0095674 A1* 3/2019 Ko ....................... H01L 27/3227
2019/0172887 A1* 6/2019 Sun ..................... H01L 27/3272
2019/0311176 A1* 10/2019 Haddad .............. G06K 9/00046
2019/0354789 A1* 11/2019 Gu ...................... G06K 9/00087

FOREIGN PATENT DOCUMENTS

| CN | 107103307 A | 8/2017 |
| CN | 109271057 A | 1/2019 |
| CN | 109860266 A | 6/2019 |
| CN | 110047878 A | 7/2019 |
| WO | WO 2018/214481 A1 | 11/2018 |

OTHER PUBLICATIONS

International Search Report in International Application No. PCT/CN2019/120793, dated Jun. 16, 2020.
English version of International Search Report from the China National Intellectual Property Administration in corresponding International Application No. PCT/CN2019/120793, dated Jun. 16, 2020.
Partial European Search Report in European Application No. 20171848.3, dated Oct. 19, 2020.
Notification of Reason for Refusal dated Dec. 12, 2021, from the Korean Intellectual Property Office issued in counterpart Korean Application No. 10-2020-7008112.

* cited by examiner

*Primary Examiner* — Krishna P Neupane
(74) *Attorney, Agent, or Firm* — Finnegan, Henderson, Farabow, Garrett & Dunner, L.L.P.

(57) ABSTRACT

A display panel includes: a display area including a photosensitive area, and a plurality of pixel units arranged in an array in the photosensitive area, wherein a light transmitting hole is provided between adjacent pixel units in the photosensitive area.

12 Claims, 4 Drawing Sheets

DISPLAY PANEL AND TERMINAL DEVICE

CROSS-REFERENCE TO RELATED APPLICATION

This application is based upon and claims priority to Chinese Patent Application No. 201910857124.4, filed on Sep. 11, 2019, the entire content of which is incorporated herein by reference.

TECHNICAL FIELD

The present disclosure relates to the field of electronic devices, and in particular to a display panel and a terminal device.

BACKGROUND

With the development of terminal device technology, a full screen has become a major trend in the development of the terminal device.

At present, most popular models use pseudo-full-screen designs, such as bang screens, water drop screens, etc., and the screen ratio of the terminal device may be further improved.

SUMMARY

The present disclosure provides a display panel and a terminal device, which can achieve a full-screen design.

In a first aspect, a display panel comprises: a display area including a photosensitive area, and a plurality of pixel units arranged in an array in the photosensitive area, wherein a light transmitting hole is provided between adjacent pixel units in the photosensitive area.

In a second aspect, a terminal device comprises: the display panel according to the first aspect; and a photosensitive element disposed on a first side of the display panel, wherein the first side is a side facing away from a light-exiting surface of the display panel, and an orthographic projection of the photosensitive element on the light-exiting surface is in the photosensitive area.

In embodiments of the present disclosure, the photosensitive area is provided in the display area, and the light transmitting hole is provided between adjacent pixel units in the photosensitive area. In this way, a photosensitive element such as a camera module and a fingerprint module of a terminal device may be disposed under the display panel, and the photosensitive element realizes optical signal transmission through a plurality of the light transmitting holes in the display panel. Because the size of the light transmitting hole is small, based on the principle of pin-hole imaging, each hole may pass through external light in a large range, and corresponding function thereof can be implemented. At the same time, the photosensitive element is disposed under the display panel instead of being disposed on a front side of the display panel, so the full-screen design can be implemented and the appearance of the terminal device can be improved.

It is to be understood that both the foregoing general description and the following detailed description are exemplary and explanatory only and are not restrictive of the present disclosure.

BRIEF DESCRIPTION OF THE DRAWINGS

The accompanying drawings herein, which are incorporated into and constitute part of the description, illustrate embodiments of the present disclosure, and serve to explain principles of the present disclosure together with the description.

DETAILED DESCRIPTION

Figure 1:
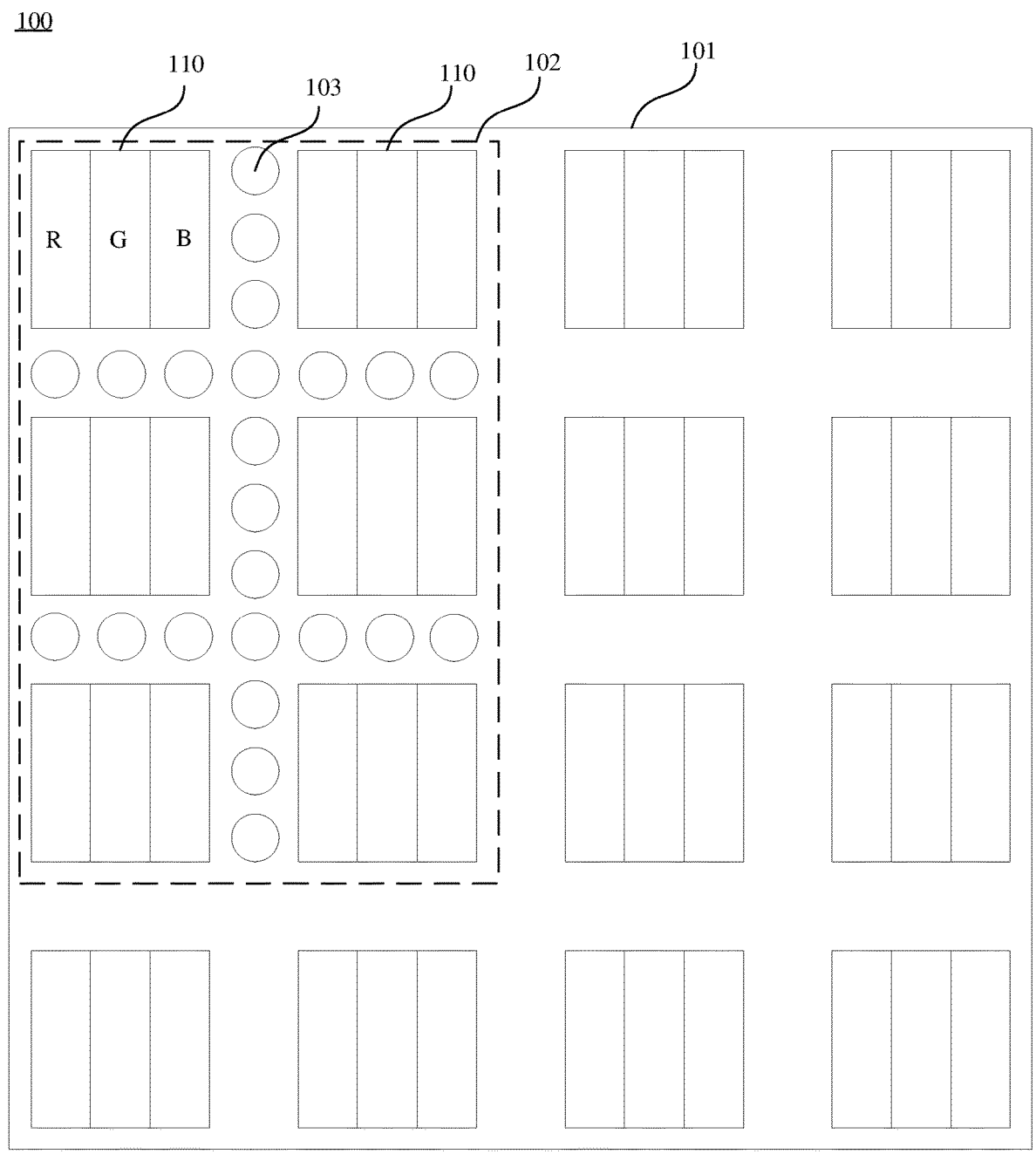
FIG. 1 is a schematic diagram of a display panel according to an embodiment of the present disclosure.

Exemplary embodiments will be described in detail herein, examples of which are illustrated in the accompanying drawings. When the following description refers to the accompanying drawings, the same reference numerals in different drawings represent the same or similar elements unless otherwise indicated. The implementations described in the following exemplary embodiments do not represent all implementations consistent with the present disclosure. Rather, they are merely examples of devices and methods consistent with some aspects of the present disclosure as recited in the appended claims.

FIG. 1 is a schematic diagram of a display panel 100 according to an embodiment of the present disclosure. Referring to FIG. 1, the display panel 100 has a display area 101 including a photosensitive area 102. A plurality of pixel units 110 are arranged in an array in the photosensitive area 102. A light transmitting hole 103 is provided between adjacent pixel units 110 in the photosensitive area 102.

In an embodiment, the light transmitting hole 103 is an optical micro-hole with a size in a micron order. As a result, light transmitting can be guaranteed, and human eyes cannot see the light transmitting hole, which does not affect the appearance of the display panel.

In the embodiments of the present disclosure, the photosensitive area is provided in the display area, and the light transmitting hole is provided between adjacent pixel units in the photosensitive area. In this way, a photosensitive element such as a camera module and a fingerprint module of a terminal device may be disposed under the display device, and the photosensitive element realizes optical signal transmission through a plurality of the light-transmitting holes in the display panel. Because the size of the light transmitting hole is small, based on the principle of pin-hole imaging, each hole may pass through external light in a large range, and corresponding function thereof can be implemented. At the same time, the photosensitive element is disposed under the display panel instead of being disposed on a front side of the display panel, so the full-screen design can be implemented and the appearance of the terminal device can be improved.

In an embodiment of the present disclosure, the display panel 100 may be an organic light emitting diode (OLED) display panel. A high resolution of the OLED display panel makes the distribution of the light transmitting holes more uniform, thereby ensuring the normal operation of the photosensitive element. In another embodiment, the display panel 100 may also be other display panels, such as a micro LED display panel, a quantum dot light emitting diode (QLED) display panel, and the like.

As shown in FIG. 1, the pixel units 110 are arranged in the entire display area 101. Each pixel unit 110 may include a plurality of sub-pixel units. For example, as shown in FIG. 1, the pixel unit 110 includes three sub-pixel units of red (R), green (G), and blue (B).

Figure 2:
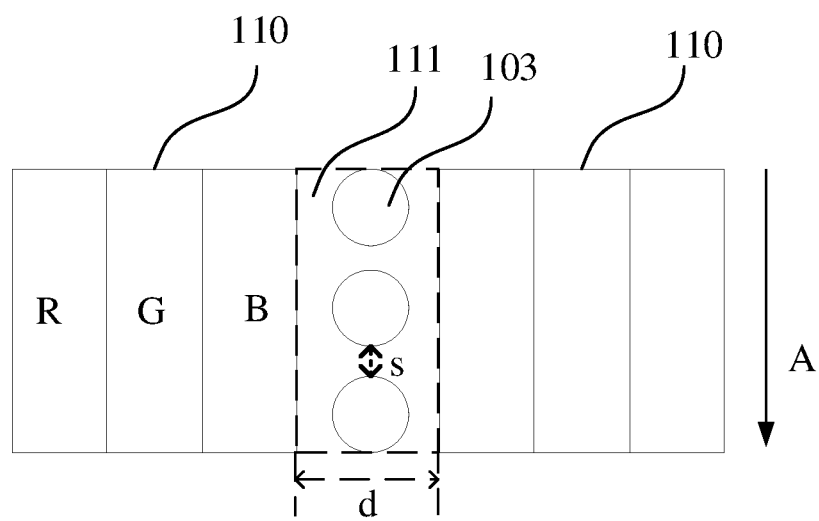
FIG. 2 is a partial enlarged view of a display panel according to an embodiment of the present disclosure.

FIG. 2 is a partially enlarged view of a display panel according to an embodiment of the present disclosure. Referring to FIG. 2, there is a strip-shaped area 111 between adjacent pixel units 110, and a plurality of light transmitting holes 103 are spaced apart or arranged at intervals along a longitudinal direction of the strip-shaped area 111.

In the embodiment, the plurality of light transmitting holes are arranged in the strip-shaped area between the adjacent pixel units, which can ensure light transmitting area in the photosensitive area, and thus can ensure that the photosensitive element can operate normally through these light transmitting holes. At the same time, there are provided a plurality of the small holes with a small distance between two holes. Therefore, the photosensitive element may obtain light from all parts in an external environment without dead parts. In this case, when a camera module is used, a whole image of the external environment can be obtained.

As shown in FIG. 2, the shapes of the three sub-pixel units R, G, and B may be rectangular (there may be a distance between the sub-pixel units, which is not shown in FIGS. 1 and 2). Accordingly, the pixel unit is also a rectangle, and the stripe-shaped area 111 between the pixel units is a rectangular area. The longitudinal direction of the stripe-shaped area 111 is the column direction A shown in FIG. 2.

In another embodiment, the shapes of the sub-pixel unit and the pixel unit may be other shapes. Accordingly, the stripe-shaped area 111 between the pixel units may be another regular or irregular-shaped area.

In an embodiment, the respective sub-pixel units in the same pixel unit are arranged in a row direction. In another embodiment, the respective sub-pixel units in the same pixel unit may also be arranged in a column direction or in an irregular manner.

Referring to FIG. 2, the light transmitting hole 103 may be a circle hole, which is easy to be designed and manufactured. The diameter of the light transmitting hole 103 may be ⅓ to ⅔ of a minimum width d of the strip-shaped area 111.

In the embodiment, the diameter of the light transmitting hole is defined to be ⅓~⅔ of the minimum width of the strip-shaped area, such that the size of the hole is prevented from being too large to affect normal arrangement of the pixels units, and the area of the hole can ensure the normal operation of the photosensitive element.

For example, the diameter of the light transmitting hole 103 may be ½ of the minimum width d of the strip-shaped area 111.

In another embodiment, the light transmitting hole 103 may have other shapes, such as a rectangle, which is not limited in the present disclosure.

Still referring to FIG. 2, a distance s between the adjacent light transmitting holes 103 may be 50% to 100% of the diameter of the light transmitting hole 103.

In the embodiment, the light transmitting holes are spaced apart, and the distance between the light transmitting holes is defined to be 50%~100% of the diameter of the light-transmitting hole. Accordingly, it can prevent the holes from being connected to each other to make the hole too large to be observed by human eyes, and the distance between the holes is prevented from being too large to affect the number of the holes. Thus, a light transmitting area can be provided, and light can be obtained from all parts in the external environment without dead parts by pin-hole imaging.

In an embodiment, the distance s between the adjacent light transmitting holes 103 may be 50% of the diameter of the light transmitting hole 103.

Figure 3:
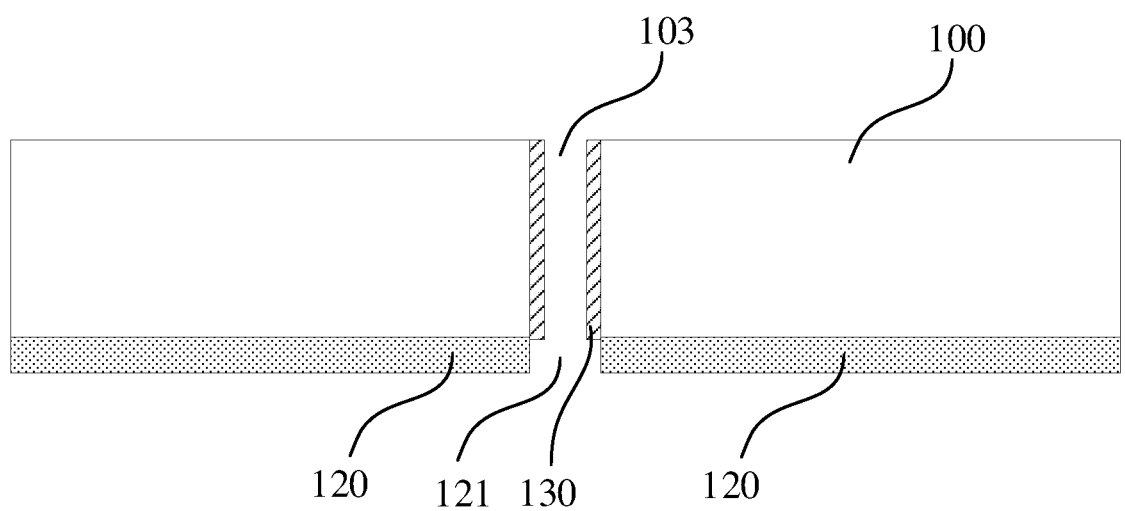
FIG. 3 is a schematic diagram of a display panel according to an embodiment of the present disclosure.

FIG. 3 is a schematic diagram of a display panel according to an embodiment of the present disclosure. Referring to FIG. 3, a light shielding layer 120 is provided on an inner side surface of the display panel 100, and a via hole 121 is provided in the light shielding layer 120 to correspond to the light transmitting hole 103. The inner side surface and a light exiting surface of the display panel 100 are two opposite surfaces of the display panel.

In the embodiment, the light shielding layer is disposed on the inner side surface of the display panel to shield light generated by the display panel to prevent the same from reaching the photosensitive element and thus affecting a normal operation of the photosensitive element. At the same time, the light shielding layer does not shield the light transmitting hole, so that external light signal may still pass through the light transmitting hole, which can ensure the normal operation of the photosensitive element.

When the via hole 121 is provided in the light shielding layer 120 to correspond to the light transmitting hole 103, the projection of the light transmitting hole 103 on the light-exiting surface overlaps the projection of the via hole 121 on the light-exiting surface, so as to ensure that the light passing through the light transmitting hole is not blocked.

In an embodiment, the light shielding layer 120 may be made of a metal layer or other light-shielding ink (for example, a black ink). For example, when the metal layer is used, the film layer of the display panel may be directly formed on the metal layer. Also for example, when the light-shielding ink is used, the light-shielding ink may be applied on the display panel after the display panel is manufactured.

Still referring to FIG. 3, a light shielding film 130 is disposed on a sidewall of the light transmitting hole 103.

In the embodiment, the light shielding film is coated on the side wall of the light transmitting hole, which can further prevent the light generated by the display panel from affecting the photosensitive element.

In an embodiment, the light-shielding film 130 may be a light-shielding ink film. For example, the light-shielding ink film 130 may be fabricated on the sidewall of the light transmitting hole 103 by spray coating, printing, evaporation, or other methods.

Figure 4:
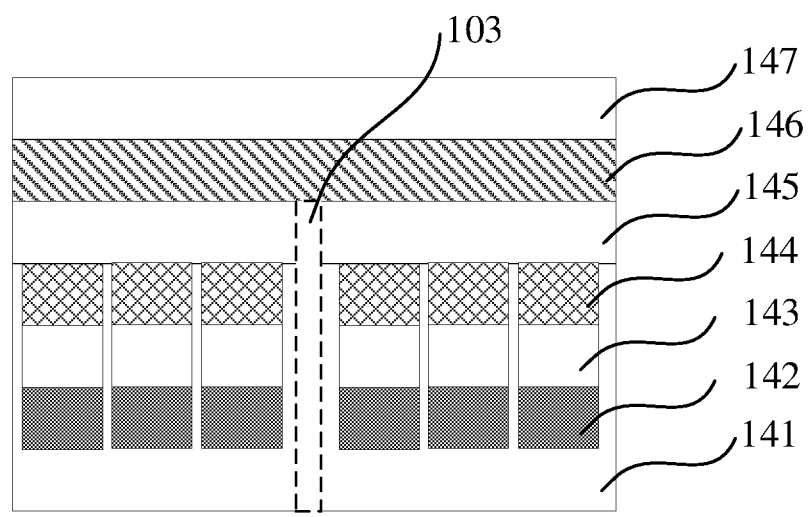
FIG. 4 is a schematic diagram of a layer stack of a display panel according to an embodiment of the present disclosure.

FIG. 4 is a schematic diagram of a layer stack of a display panel according to an embodiment of the present disclosure. As shown in FIG. 4, the display panel 100 includes a pixel defining layer 141, a cathode layer 142, an electron transport layer 143, an organic light emitting layer 144, a hole transport layer 145, an anode layer 146, and a protective layer 147, which are stacked.

The pixel defining layer 141 is configured to define a plurality of grooves, and each groove corresponds to a sub-pixel unit. The cathode layer 142, the electron transport layer 143, and the organic light emitting layer 144 are all grown in the groove, that is, these layers each include a plurality of parts, and each part corresponds to a sub-pixel unit. For example, the cathode layer, electron transport layer, and organic light emitting layer of each sub-pixel are formed in the groove. The hole transport layer 145, the anode layer 146, and the protective layer 147 are designed on the entire surface, and do not need to be divided according to the sub-pixel units.

The electron transport layer 143, the organic light emitting layer 144, and the hole transport layer 145 can all be formed by printing or evaporation of an organic material. The cathode layer 142 may be a metal cathode, and the anode layer 146 may be an indium tin oxide (ITO) anode. The protective layer 147 may be a glass plate.

In an embodiment, although the cathode layer 142 is a metal cathode, and has a light-shielding property, since there is no cathode in the area between the sub-pixels, the light of the display panel can still pass through, so the aforementioned light-shielding layer 120 needs to be provided for shielding.

In an embodiment, since the light transmitting holes 103 are formed between the pixel units, the light transmitting holes 103 may penetrate through the pixel defining layer 141, the hole transport layer 145, the anode layer 146, and the protective layer 147. The protective layer 147 is a glass plate, and the anode layer 146 is an ITO layer, both of which are transparent, so the light transmitting hole 103 only needs to penetrate through the pixel defining layer 141 and the hole transport layer 145. For example, each of the cathode layer 142, the electron transport layer 143, and the organic light emitting layer 144 is not formed integrally, and is disposed in a sub-pixel area, and each of the anode layer 146 and the protective layer 147 is formed integrally and is a transparent film layer. Accordingly, the light emitting hole 103 only needs to penetrate through the pixel defining layer 141 and the hole transport layer 145. That is, the light transmitting hole 103 penetrates through a non-transparent film layer in the display panel.

In the embodiment, the light transmitting hole is formed only in the non-transparent film layer, which can reduce workload of forming the hole on the one hand, and ensure the overall strength of the panel on the other hand.

In an embodiment, the light shielding layer 120 is disposed on the bottom surface (the side facing away from the light exiting surface) of the pixel defining layer 141 of the display panel 100.

FIG. 4 provides a schematic diagram of a passive-driving (PM) OLED display panel. When the OLED display panel is an active-driving (AM) OLED display panel, the display panel further includes a thin film transistor array, the aforementioned pixel defining layer 141 is disposed on the thin film transistor array, and the aforementioned light transmitting holes simultaneously penetrate through the non-transparent film layers in the thin film transistor array. The light shielding layer 120 is disposed on the bottom surface (the side facing away from the light exiting surface) of the thin film transistor array of the display panel 100.

In some embodiments, the light transmitting holes 103 may penetrate through all the film layers in the display panel.

In an embodiment of the present disclosure, the light transmitting hole 103 may be made by a laser drilling method, or may be made by a patterning process (such as an etching process).

It is to be noted that because the cathode layer or the electrode layer in the thin film transistor array includes wirings in addition to electrodes, and these wirings usually extend between the pixel units, in order to avoid the impact of forming the light transmitting holes on the normal display function, the aforementioned light transmitting holes and wirings may be staggered.

In an embodiment of the present disclosure, the display panel may be provided with one or more photosensitive areas, and one photosensitive area may correspond to one or more photosensitive elements. Each photosensitive element corresponds to a plurality of pixel units, such as hundreds of pixel units.

Figure 5:
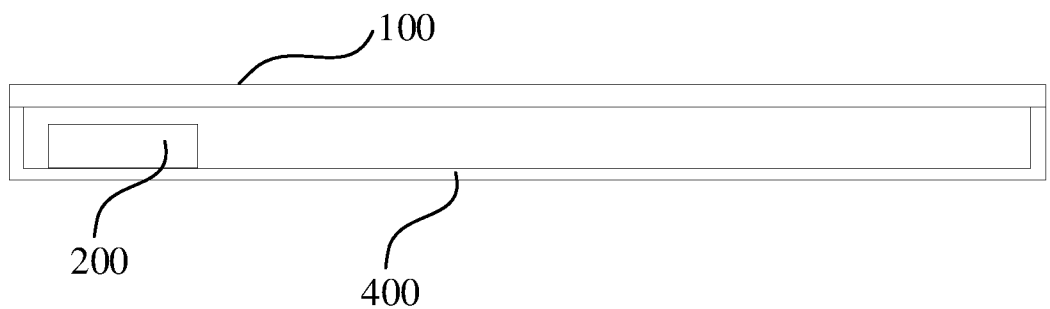
FIG. 5 is a schematic diagram of a terminal device according to an embodiment of the present disclosure.

FIG. 5 is a schematic diagram of a terminal device according to an embodiment of the present disclosure. Referring to FIG. 5, the terminal device includes the display panel 100 described above in connection with FIGS. 1 to 4, and further includes a photosensitive element 200. The photosensitive element 200 is located on a first side of the display panel 100. The first side is a side facing away from the light exiting surface of the display panel 100. The orthographic projection of the photosensitive element 200 on the light exiting surface is located in the photosensitive area 102.

Figure 6:
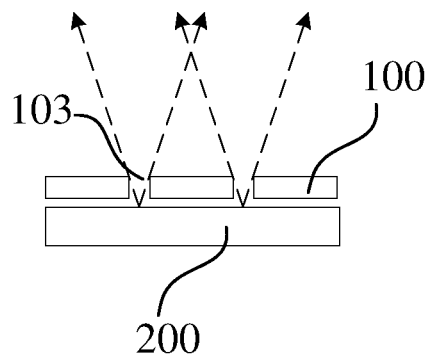
FIG. 6 is an operating schematic diagram of a terminal device according to an embodiment of the present disclosure.

FIG. 6 is an operating schematic diagram of a terminal device according to an embodiment of the present disclosure. Referring to FIG. 6, since the size of the light transmitting hole 103 is small, based on the principle of pin-hole imaging, each hole can pass a large range of external light, and because the distance between the two holes is small, the photosensitive element can obtain light from all parts in the external environment without dead part. In this way, when using the camera module, an external whole image can also be obtained.

Figure 7:
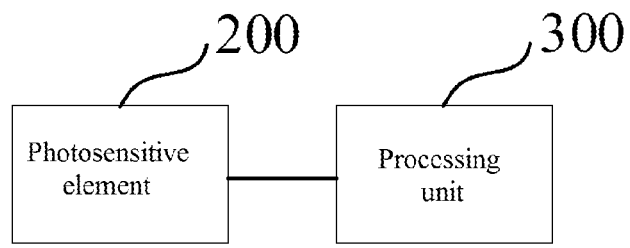
FIG. 7 is a block diagram of a terminal device according to an embodiment of the present disclosure.

FIG. 7 is a block diagram of a terminal device according to an embodiment of the present disclosure. Referring to FIG. 7, the terminal device further includes: a processing unit 300 configured to perform filtering processing on an electrical signal generated by the photosensitive element 200.

In the embodiment, the processing unit 300 may be a processor and is employed to perform the filtering processing on the electrical signal of the photosensitive element, so that the noise of the electrical signal of the photosensitive element 200 is reduced and thus the electrical signal has high accuracy.

In an embodiment, the processing unit 300 is configured to perform differential processing on the electrical signal generated by the photosensitive element 200 and a preset signal, and the preset signal is an electrical signal when the photosensitive element 200 receives only light generated by the display panel.

In the embodiment, the processing unit may filter signal through differential processing. The processing unit may first obtain and store the electrical signal only when the light is generated by the display panel as the preset signal. When performing the processing, the preset signal is subtracted from the electrical signal to filter the signal. The filtered signal is then processed.

In the embodiment, the preset signal can be obtained in an environment with no external light, for example, at night or in a dark closed space, and then stored in the terminal device for use by the processing unit.

In an embodiment of the present disclosure, the photosensitive element 200 may include at least one of a camera module, an optical sensor, and an optical fingerprint module.

The camera module may include one or more cameras. Optical sensors can be infrared sensors, laser sensors, and other types of sensors. According to their functions, the sensors can be ambient light detection sensors, distance sensors, etc. By taking infrared sensors as an example, light emitted by the emitting part of the infrared sensor passes through the light transmitting hole, is reflected by an external object, and then received by a receiving part to generate an electrical signal.

In an embodiment of the present disclosure, the electrical signal generated by the photosensitive element 200 through photoelectric conversion may be collected by an acquisition circuit, and then sent to the processing unit for processing.

The acquisition circuit may include a capacitor, an analog-to-digital converter, and an integrating circuit. The photocurrent signal generated by the photosensitive element 200 is supplied to the capacitor to form a voltage signal; the analog-to-digital converter performs signal acquisition on the voltage signal to obtain a digital signal, and outputs the digital signal to the integrating circuit for processing. If the acquired signal is small, or the ambient light conditions are dark, or the ambient light conditions are bright, the processing unit performs corresponding configuration through bus control to increase parameters such as integrating time of the integrating circuit and op-amp gain so as to adjust signal amplitude.

The aforementioned processing unit also has a logic control circuit to control the output of the acquisition circuit. The logic control circuit can control turning on/off of a switch transistor between the acquisition circuit and the processing unit through the address line. When the switch transistor is on, the processing unit can obtain the digital signal output by the analog-to-digital converter through the bus, and process and store the digital signal.

Referring back to FIG. 5, the terminal device further includes a casing 400. The photosensitive element 200 may be disposed on the casing 400, and the position of the photosensitive element 200 on the casing 400 may be disposed to directly face the aforementioned photosensitive area.

Those skilled in the art will readily contemplate other embodiments of the present disclosure after considering the specification and practicing the invention disclosed herein. The present application is intended to cover any variations, uses, or adaptations of the present disclosure that conform to the general principles of the present disclosure and include the common knowledge or conventional technical means in the technical field not disclosed by the present disclosure. It is intended that the specification and examples be considered as exemplary only, with a true scope and spirit of the present disclosure being indicated by the following claims.

It should be understood that the present disclosure is not limited to the precise structure that has been described above and illustrated in the accompanying drawings, and various modifications and changes may be made without departing from the scope thereof. The scope of the present disclosure is limited only by the following claims.

What is claimed is:

1. A display panel, comprising:
    a display area including a photosensitive area; and
    a plurality of pixel units arranged in an array in the photosensitive area, wherein a light transmitting hole is provided between adjacent pixel units in the photosensitive area,
    wherein the light transmitting hole penetrates through a non-transparent film layer in the display panel;
    wherein the display panel is an organic light emitting diode (OLED) display panel including a pixel defining layer, a cathode layer, an electron transport layer, an organic light emitting layer, a hole transport layer, an anode layer, and a protective layer in a stacked arrangement;
    wherein a light shielding film is disposed on side walls of the pixel defining layer and the hole transport layer in the light transmitting hole; and
    wherein the anode layer and the protective layer are transparent and cover the light transmitting hole, and the light transmitting hole penetrates through the pixel defining layer and the hole transport layer and does not penetrate the anode layer and the protective layer.

2. The display panel according to claim 1, wherein a light shielding layer is disposed on an inner side surface of the display panel, a via hole is disposed in the light shielding layer to correspond to the light transmitting hole, and the inner side surface and a light-exiting surface of the display panel are two opposite surfaces of the display panel.

3. The display panel according to claim 1, wherein a strip-shaped area is located between the adjacent pixel units, and a plurality of light transmitting holes are spaced apart in a longitudinal direction of the strip-shaped area.

4. The display panel according to claim 3, wherein the light transmitting hole is a circular hole with a diameter being ⅓~⅔ of a minimum width of the strip-shaped area.

5. The display panel according to claim 3, wherein a distance between adjacent light transmitting holes is 50%~100% of the diameter of the light transmitting hole.

6. A terminal device, comprising:
    a display panel, wherein the display panel includes a display area that further includes a photosensitive area; and a plurality of pixel units arranged in an array in the photosensitive area, a light transmitting hole being provided between adjacent pixel units in the photosensitive area; and
    a photosensitive element disposed on a first side of the display panel, wherein the first side is a side facing away from a light-exiting surface of the display panel, and an orthographic projection of the photosensitive element on the light-exiting surface is in the photosensitive area,
    wherein the light transmitting hole penetrates through a non-transparent film layer in the display panel;
    wherein the display panel is an organic light emitting diode (OLED) display panel including a pixel defining layer, a cathode layer, an electron transport layer, an organic light emitting layer, a hole transport layer, an anode layer, and a protective layer in a stacked arrangement;
    wherein a light shielding film is disposed on side walls of the pixel defining layer and the hole transport layer in the light transmitting hole; and
    wherein the anode layer and the protective layer are transparent and cover the light transmitting hole, and the light transmitting hole penetrates through the pixel defining layer and the hole transport layer and does not penetrate the anode layer and the protective layer.

7. The terminal device according to claim 6, further comprising:
    a processor configured to perform filtering processing on an electrical signal generated by the photosensitive element.

8. The terminal device according to claim 7, wherein the processor is further configured to perform differential processing on the electrical signal generated by the photosensitive element and a preset signal, the preset signal being an electrical signal generated when the photosensitive element receives only light generated by the display panel.

9. The terminal device according to claim 6, wherein the photosensitive element comprises at least one of a camera module, an optical sensor, and an optical fingerprint module.

10. The terminal device according to claim 6, wherein a light shielding layer is disposed on an inner side surface of the display panel, a via hole is disposed in the light shielding layer to correspond to the light transmitting hole, and the inner side surface and a light-exiting surface of the display panel are two opposite surfaces of the display panel.

11. The terminal device according to claim 6, wherein a strip-shaped area is located between the adjacent pixel units, and a plurality of light transmitting holes are spaced apart in a longitudinal direction of the strip-shaped area.

12. The terminal device according to claim 11, wherein the light transmitting hole is a circular hole with a diameter being $\frac{1}{3} \sim \frac{2}{3}$ of a minimum width of the strip-shaped area.

* * * * *